US005802006A

United States Patent [19]
Ohta

[11] Patent Number: 5,802,006
[45] Date of Patent: Sep. 1, 1998

[54] SEMICONDUCTOR MEMORY OF MULTIPLE-BANK STRUCTURE HAVING BLOCK WRITE FUNCTION

[75] Inventor: Ken Ohta, Tokyo, Japan

[73] Assignee: NEC Corporation, Tokyo, Japan

[21] Appl. No.: 803,248

[22] Filed: Feb. 20, 1997

[30] Foreign Application Priority Data

Feb. 21, 1996 [JP] Japan ................................. 8-033882

[51] Int. Cl.$^6$ ................................................. G11C 7/00
[52] U.S. Cl. ................ 365/230.03; 365/191; 365/230.06
[58] Field of Search ............................ 365/230.03, 191, 365/230.06

[56] References Cited

U.S. PATENT DOCUMENTS 5,596,740  1/1997  Quattromani et al. ......... 365/230.03 X
5,617,555  4/1997  Patel et al. ..................... 365/230.03 X

*Primary Examiner*—Do Hyun Yoo
*Attorney, Agent, or Firm*—Whitham, Curtis & Whitham

[57] ABSTRACT

A semiconductor memory includes an A-bank and a B-bank and has a block write function. Each bank includes a memory cell array and a block write controller associated thereto responding to a bank selection signal and a block write enable signal, for realizing a block writing to the associated memory cell array. The semiconductor memory includes a bank selection circuit controlled at the time of the block writing by a control signal generated in response to the block write command, for simultaneously activating two block write enable signals which are supplied to respective block write control means of the A-bank and the B-bank, so that the block writing is simultaneously executed in the A-bank and the B-bank.

5 Claims, 6 Drawing Sheets

5,802,006

SEMICONDUCTOR MEMORY OF MULTIPLE-BANK STRUCTURE HAVING BLOCK WRITE FUNCTION

BACKGROUND OF THE INVENTION

1. Field of the Invention

The present invention relates to a semiconductor memory, and more specifically to a semiconductor memory of a multiple-bank structure having a block write function.

2. Description of Related Art

In the prior art, a semiconductor memory of a multiple-bank structure having a block write function has been widely used, as a video RAM (random access memory) and a graphic RAM, in a device of allocating each of pixels of a display screen to one of the cells in a memory cell array, for the purpose of controlling a screen display.

Referring to FIG. 1, there is shown a block diagram of a portion of one example of a conventional semiconductor memory of the multiple-bank structure having the block write function. The shown conventional semiconductor memory is generally designated with Reference Numeral 100, and is of a two-bank structure, which includes a common controller 102, and an A-bank 104A and a B-bank 104B each including a memory cell array 106A or 106B and a block write controller 108A or 108B. In FIG. 1, for simplification of the drawing, a construction for a row access is omitted since it does not have a close relation to the present invention and since it is well known to persons skilled in the art.

Each of the block write controllers 108A and 108B is configured to be able to simultaneously write a specific data of the amount corresponding to 8 columns, into a specific block included in the associated memory cell array and designated by a column address signal of 6 bits. For this purpose, each the block write controller 108A and 108B receives a block write enable signal 110 of one bit, color data 114 of one bit, and column mask data 116 of 8 bits, as signals for controlling the block write function, and also receives, a bank selection signal of one bit (A-bank selection signal 122A or B-bank selection signal 122B), a high order address signal 120 of 3 bits, a low order address signal 118 of 3 bits, and write data 112 of one bit, as control signals which are used in common the an ordinary memory operation. These signals supplied to each of the A-bank 104A and the B-bank 104B are supplied from the common controller 102 in the semiconductor memory 100. The signals other than the write data are controlled in accordance with a command word of a block write command designating the block write function and supplied from an external device, and are outputted at the time of the block writing.

The block write enable signal 110 is generated at the time of the block writing, in response to the block write command designating the block write function and supplied from an external device. The color data 114 is ,input signal in common with the specific data of the amount corresponding to 8 columns to be written into a specific block included in the associate d memory cell array and designated by the column address signal 118+120 of 6 bits at the time of the block writing. This color data 114 is supplied from a color register (not shown in FIG. 1 but provided in the common controller 102 of the semiconductor memory 100). The column mask data 116 of 8 bits is a mask pattern for selectively masking the writing of the color data 114 into 8 memory cells which corresponds to the 3 bits of the low order column address signal 118 and which are to be simultaneously written at the time of the block writing. This column mask data 116 is supplied from a column mask register (not shown in FIG. 1 but provided in the common controller 102 of the semiconductor memory 100).

Each of the bank selection signals 122A and 122B is a signal for designating the bank to be data-accessed, and is used for controlling the access to all data within each bank, including the time of the block writing. Since the example shown in FIG. 1 is of the two-bank structure, a bank address signal 124 generated in the common controller 102 is supplied without modification as the A-bank selection signal 122A, and after being inverted by an inverter 126, as the B-bank selection signal 122B.

The high order column address signal 120 of 3 bits and the low order column address signal 118 of 3 bits constitute as a whole a column address designating a memory cell column to be accessed, included in the memory cell array. FIG. 2 illustrates a relation between the column address, a row address and the bank address in a memory for a display screen of 1024 pixels×768 pixels.

The write data 112 is data to be written in an ordinary memory operation other than the block writing.

Referring to FIG. 3, there is shown a circuit diagram of a portion of the block write controller provided in each bank. In FIG. 3, the shown memory bank is designated by Reference Numeral 104 as a representative of both the memory banks 104A and 104B, and the shown block write controller is designated by Reference Numeral 108 as a representative of both the block write controllers 108A and 108B. The block write controller 108 is associated to a memory cell array having a number of memory cells 200 arranged in the form of a matrix, and a plurality of word lines 202 and a plurality of bit lines 204 which are located intersect to each other so that one memory cell is located at each of a number of intersections formed between the word lines 202 and the bit lines 204. For simplification of the drawing, only one memory cell 200, one word line 202, and a few bit lines 204 are shown in FIG. 3. Furthermore, similar to FIG. 1, a construction for a row access is omitted in FIG. 3 since it does not have a close relation to the present invention and since it is well known to persons skilled in the art.

The block write controller 108 includes two selectors 91 and 92, two column decoders 93 and 94, an inverter 95, a number of logic gates G00 to G77, and a number of selection switch pairs SW00 to SW77, which are connected as shown in FIG. 3. The block write controller 108 is connected to the memory cells of the associated memory cell array through the bit lines 204.

The column decoder 93 receives the low order column address signal 118 of 3 bits and outputs a selection signal of eight bits, only one of which is selectively activated. Similarly, the column decoder 94 receives the high order column address signal 120 of 3 bits and outputs a selection signal of eight bits, only one of which is selectively activated. The selector 91 receives the write data 112 of one bit and the color data 114 of one bit, and controlled by the block write enable signal 110 to select the color data 114 at the time of the block writing in accordance with the block write enable signal, and to output the selected data as data to be written to the memory cell array. At the time other than the block writing, the selector 91 selects and outputs the write data 112. The selector 92 receives the 8-bit selection signal outputted from the column decoder 93 and the column mask data 116 of 8 bits, and is also controlled by the block write enable signal 110 to select the column mask data 116 of 8 bits at the time of the block writing in accordance with the block write enable signal 110, and to output the selected data to the logic gates G00 to G77. At the time other than the block writing, the selector 92 selects and outputs the 8-bit selection signal outputted from the column decoder 93.

Each of the logic gates G00 to G77 has three inputs receiving a selected one of the eight bits ("0"to "7") outputted from the selector 92, a selected one of the eight bits ("0"to "7") outputted from the column decoder 94, find a bank selection signal 122 (corresponding to the A-bank selection signal 122A or the B-bank selection signal 122B), and outputs one Y-switch signal 96 to a corresponding switch pair of selection switch pairs SW0010 SW77. Thus, the logic gates include logic gates G00 to G07, G10 to G17, G20 to G27, G30 to G37, G40 to G47, G50 to G57, G60 to G67, G70 to G77 corresponding to a combination of one bit selected from the eight bits ("0" to "7") outputted from the selector 92 and one bit selected from the eight bits ("0" to "7") outputted from the column decoder 94.

Each switch pair of the selection switch pairs SW00 to SW77 includes a first switch MOS transistor M1 and a second switch MOS transistor M2 which have a gate connected in common to a corresponding Y-switch signal 96. The first switch MOS transistor M1 is connected between a corresponding bit line 204 and a bank data bus line 97A connected to an output of the selector 91, and the second switch MOS transistor M2 is connected between a corresponding bit line and a complementary bank data bus line 97B connected to an output of an inverter 95 having an input connected to the output of the selector 91.

With this arrangement, data outputted from the selector 91 is written to a selected memory cell or cells in the memory cell array.

Now, operation of the conventional semiconductor memory shown in FIG. 1 will be described with the accompanying drawings. FIG. 4 illustrates a group of pixels, on the display screen shown in FIG. 2, corresponding to one block to be written by a block write function. FIG. 5 is a timing chart illustrating an example of the operation for painting out the pixels within a window region surrounded by a thick solid line frame in FIG. 4, by action of the block write function. In FIG. 5, "CLK" shows a clock pulse.

In response to a block write command supplied from an external device, the block write enable signal 110 and the A-bank selection signal 122A are activated. A row address "s" is read in response to a row address strobe signal RAS, and a heading column address "m" of a block is read in response to a column address strobe signal CAS, so that eight memory cell to be written by the block write function are simultaneously selected. These eight memory cells correspond to the memory cells which are included in the A-bank 104A and which are of the amount corresponding to the three bits of the low order column address signal 118. At the same time, the color data 114 is selected as the data to be written into the memory cell array, and the color data 114 written into the eight memory cells is mask-controlled by the column mask data 116 of 8 bits. In the example shown in FIG. 4, the column mask data of 8 bits is constituted of "00001111".

Then, in response to a next block write command supplied from the external device, the block write enable signal 110 and the B-bank selection signal 122B are activated. A row address "s" is read in response to a next row address strobe signal RAS, and a heading column address "m" of a block is read in response to a next column address strobe signal CAS, so that eight memory cells to be written by the block write function are simultaneously selected. These eight memory cells correspond to the memory cells which are included in the B-bank 104B and which are of the amount corresponding to the three bits of the low order column address signal 118. At the same time, the color data 114 is selected as the data to be written into the memory cell array, and the color data 114 written into the eight memory cells is mask-controlled by the column mask data 116 of 8 bits, namely, "00001111".

There after, in response to a third block write command supplied from the external device, the block write enable signal 110 and the A-bank selection signal 122A are activated, and a row address "s+1" is read in response to a third row address strobe signal RAS, and a heading column address "m" of a block is read in response to a third column address strobe signal CAS, so that eight memory cells to be written by the block write function are simultaneously selected. These eight memory cells correspond to the memory cells which are included in the A-bank 104A and which are of the amount corresponding to three bits of the low order column address signal. At the same time, the color data is selected as the data to be written into the memory cell array, and the color data written into the eight memory cells is mask-controlled by the column mask data of 8 bits, namely, "00001111".

With the above mentioned three cycles of the block writing, the pixels in the window region defined by the thick solid line frame in FIG. 4 are painted out by the same color.

The above mentioned block write function of the conventional semiconductor memory is a function of rapidly painting out the pixels in a specified window region of, a display screen by a color data. However, the more complicated the shape of a specified window region on a display screen becomes, and the larger the number of the window regions displayed becomes, the longer the writing time required for the block writing becomes. Accordingly, a speed-up of the block write function is further desired.

SUMMARY OF THE INVENTION

Accordingly, it is an object of the present invention to provide a semiconductor memory of a multiple-bank structure having a block write function, which will overcome the above mentioned defect of the conventional apparatus.

Another object of the present invention is to provide a semiconductor memory of a multiple-bank structure having a speeded-up block write function.

The above and other objects are achieved in accordance with the present invention by a semiconductor memory of a multiple-bank structure having a block write function in which a specific data can be written to a specific block included in a memory cell array and designated by an address signal, comprising:

a plurality of banks, each of which includes a memory cell array and a block write control means associated thereto responding to a bank selection signal and a block write enable signal generated at the time of a block writing in accordance with a block write command supplied from an external device and designating the block writing, for realizing a block writing to the associated memory cell array; and a bank selection means controlled at the time of the block writing by a control signal generated in response to the block write command, for simultaneously activating a plurality of block write enable signals which are supplied to respective block write control means of a corresponding number of banks of the plurality of banks, so that the block writing is simultaneously executed in the corresponding number of banks.

More specifically, the block write command includes an address designating bit field designating the above mentioned address signal, and the control signal corresponds to a portion of the address designating bit field.

The above and other objects, features and advantages of the present invention will be apparent from the following description of a preferred embodiment of the invention with reference to the accompanying drawings.

DESCRIPTION OF THE PREFERRED EMBODIMENTS

Figure 6:
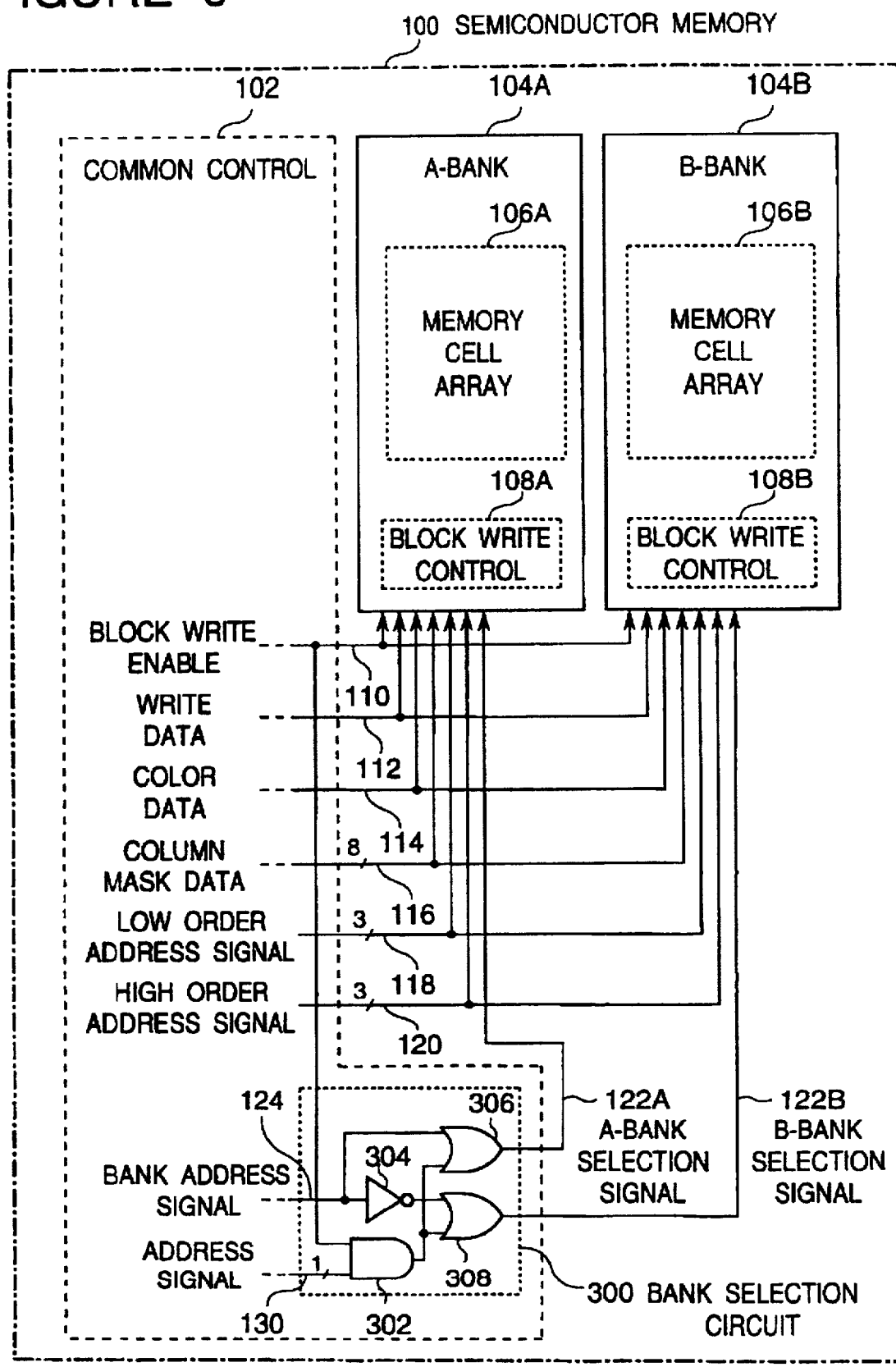
FIG. 6 is a block diagram of a portion of one embodiment of the semiconductor memory in accordance with the present invention of the multiple-bank structure having the speeded-up block write function.

Referring to FIG. 6, there is shown a block diagram of a portion of one embodiment of the semiconductor memory in accordance with the present invention of the multiple-bank structure having the speeded-up block write function. In FIG. 6, elements corresponding to those shown in FIG. 1 are given the same Reference Numerals, and explanation thereof will be omitted.

Figure 1:
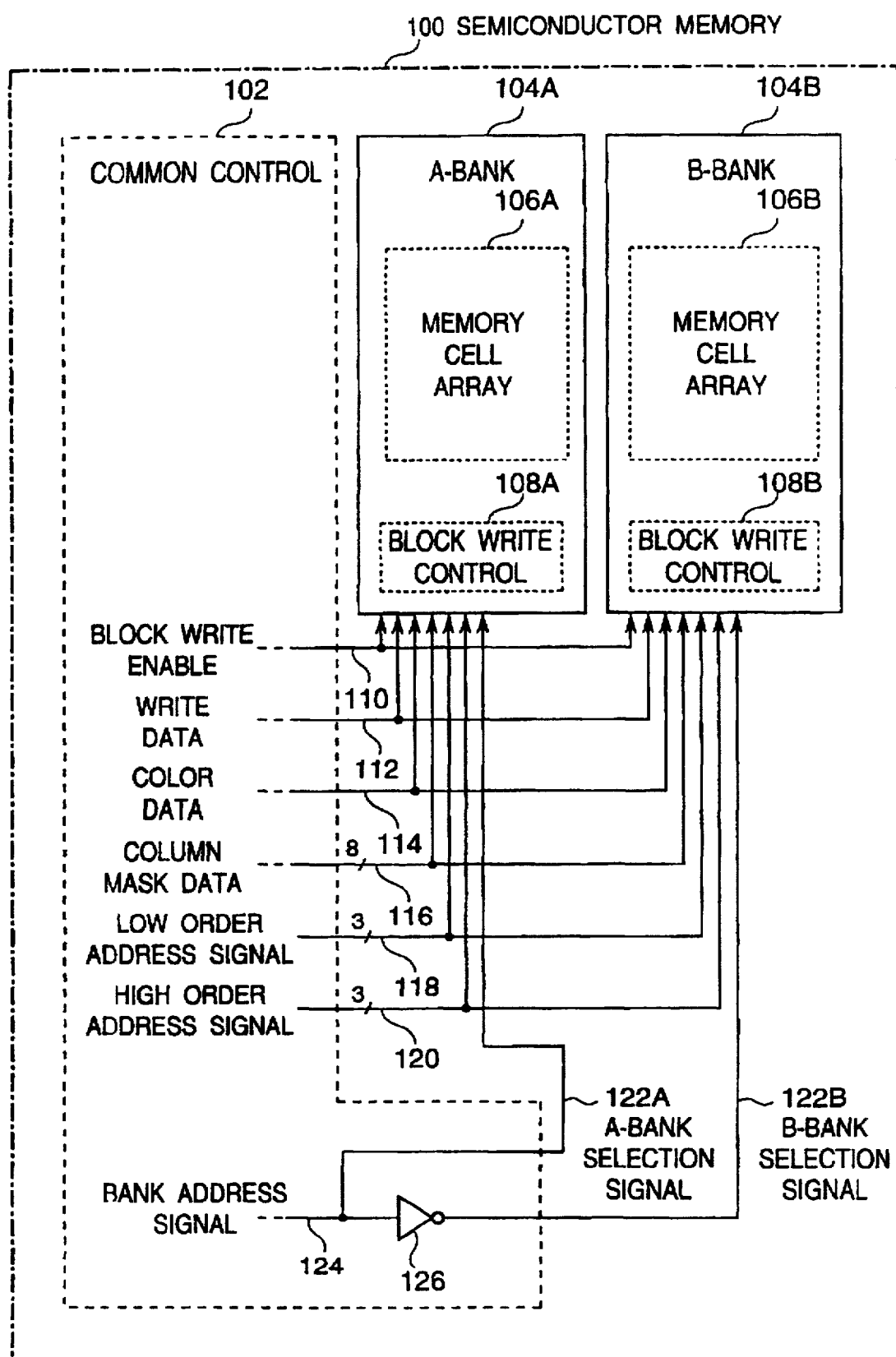
FIG. 1 is a block diagram of a portion of one example of a conventional semiconductor memory of the multiple-bank structure having the block write function.
Figure 2:
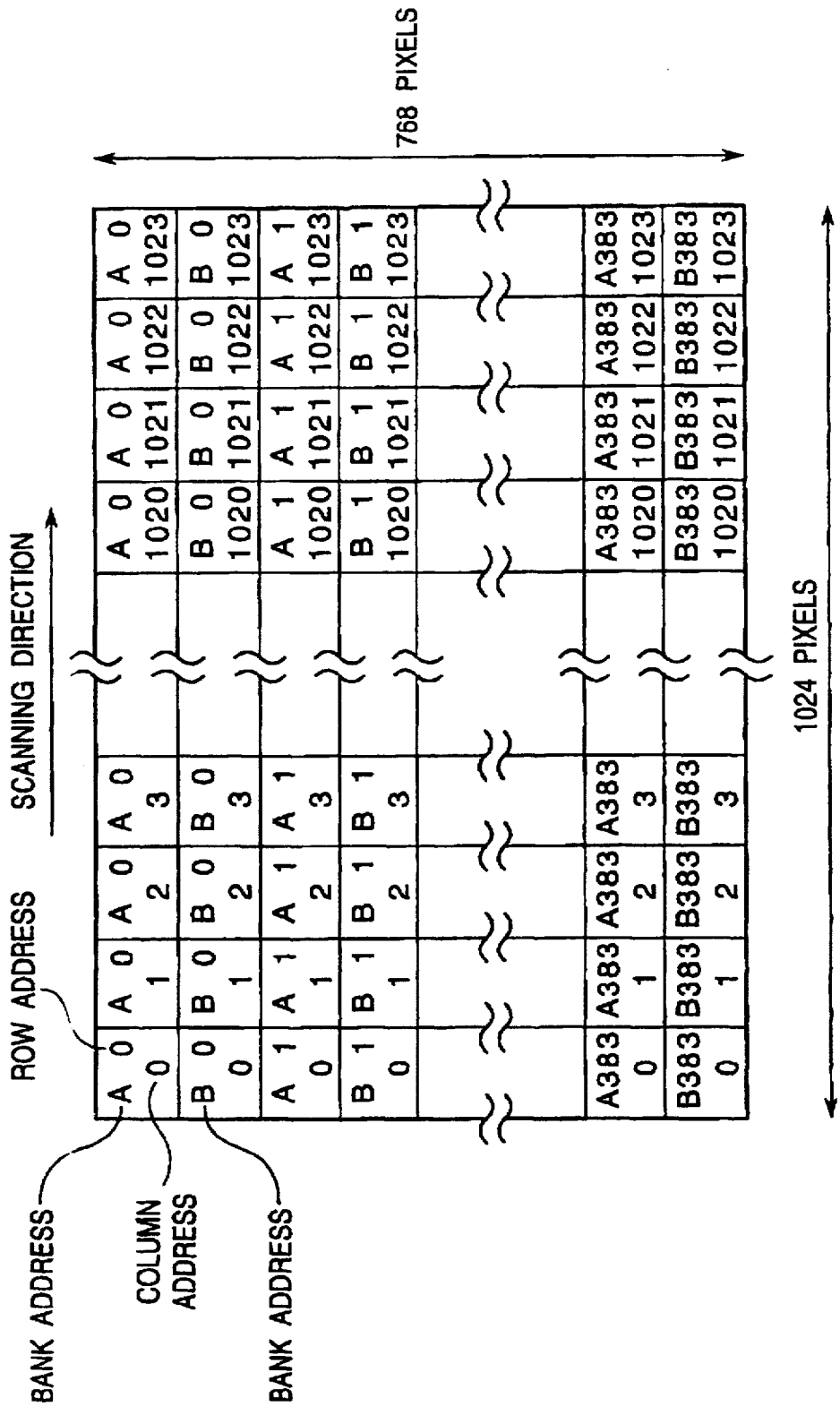
FIG. 2 illustrates a relation between a column address, a row address and a bank address in a memory for a display screen.
Figure 3:
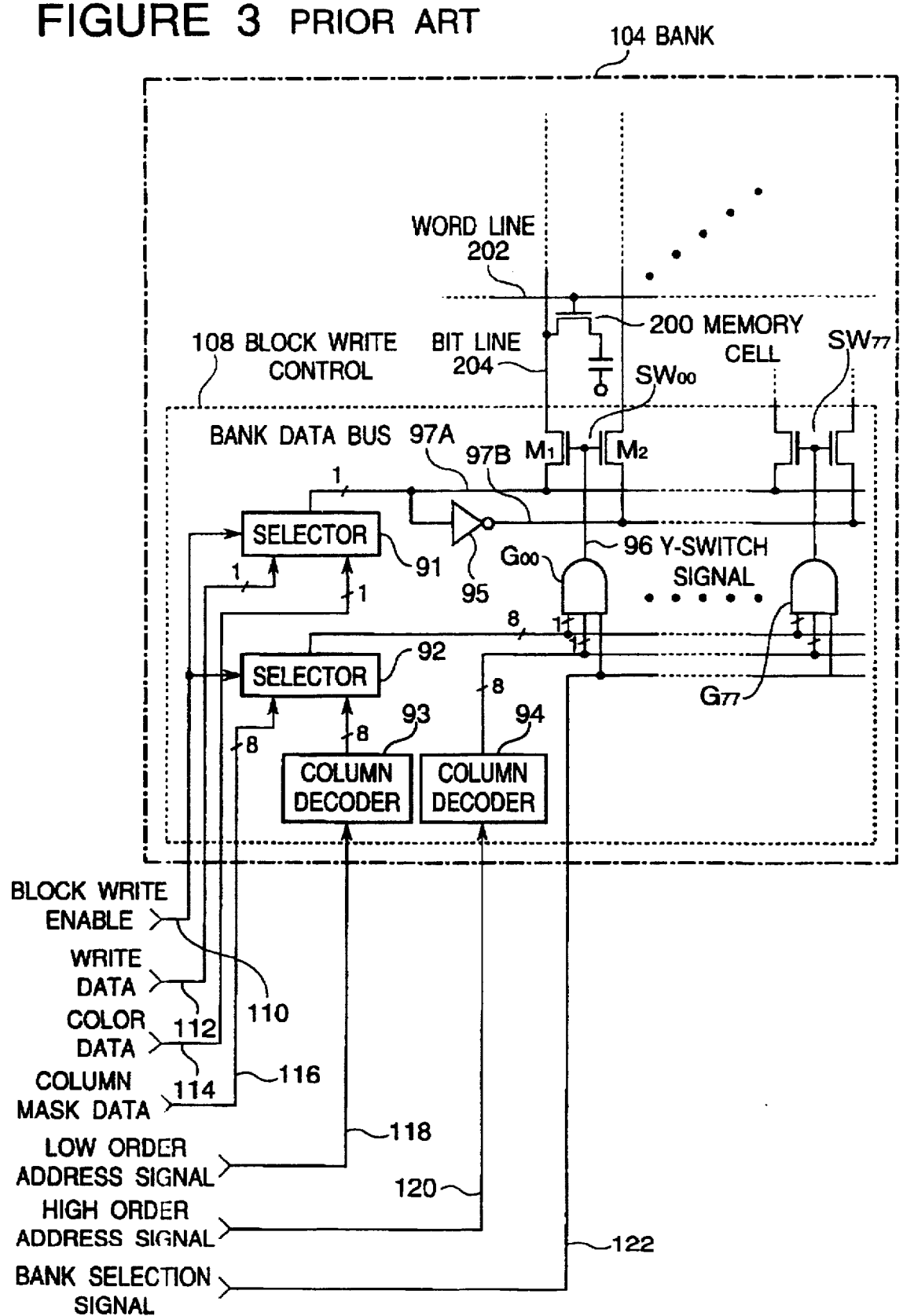
FIG. 3 is a circuit diagram of a portion of the block write controller provided in each bank shown in FIG. 1.

As seen from comparison between FIG. 1 and 6, the depicted FIG. 6 embodiment is different from the conventional example only in that the FIG. 6 embodiment includes a bank selection circuit 300. This bank selection circuit 300 is constituted of a decoder which includes an AND gate 302, an inverter 304 and two OR gates 306 and 308 connected as shown and which receives the block write enable signal 110 and an address designating signal 130 in addition to the bank address signal 124, and generating the A-bank selection signal 122A and the B-bank selection signal 122B. The AND gate 302 receives the block write enable signal 110 and the address designating signal 130, and the inverter 304 receives the bank address signal 124. The OR gate 306 receives the bank address signal 124 and an output of the AND gate 302 and generates the A-bank selection signal 122A. The OR gate 308 receives an output of the inverter 304 and the output of the AND gate 302 and generates the B-bank selection signal 122B.

With this arrangement, when at least one of the block write enable signal 110 and the address designating signal 130 is inactive, namely at a logical low level, if the bank address signal 124 is active, the A-bank selection signal 122A is activated, and if the bank address signal 124 is inactive, the B-bank selection signal 122B is activated by action of the inverter 304. On the other hand, when both of the block write enable signal 110 and the address designating signal 130 are active, the A-bank selection signal 122A and the B-bank selection signal 122B are simultaneously activated so that the active A-bank selection signal and the active B-bank selection signal are simultaneously supplied to the block write controller 108A of the A-bank 104A and the block write controller 108B of the A-bank 104B, respectively. At this time, the address designating signal 130 is a control signal "AD" put in any one bit of the three low order address bits of the column address included in an address designating bit field included in the block write command for designating an address of memory cells to be written by the block writing, because the three low order address bits of the column address are not used at the time of the block writing.

Figure 7:
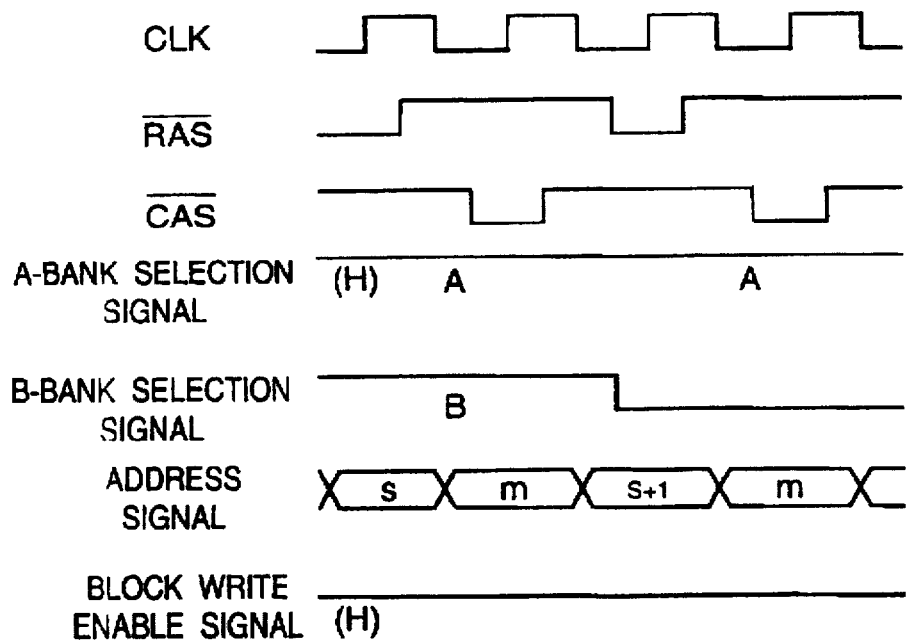
FIG. 7 is a timing chart illustrating an example of the operation of the semiconductor memory in accordance with the present invention, for painting out the pixels surrounded by a thick solid line frame in FIG. 4, by action of the block write function.
Figure 8:
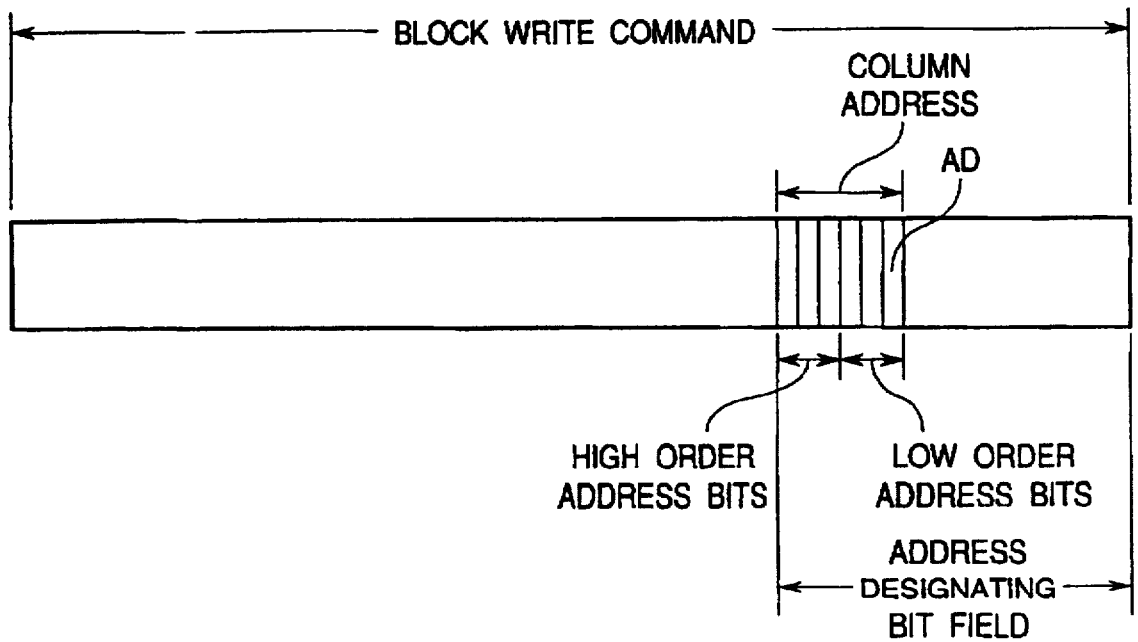
FIG. 8 illustrates a structure of the block write command, a portion of which is used to generate the address designating signal for controlling tie bank selection circuit shown in FIG. 6.

Now, operation of the semiconductor memory shown in FIG. 6 will be described with reference to FIG. 7, which is a timing chart illustrating an example of the operation of the semiconductor memory in accordance with the present invention, for painting out the pixels within the window surrounded by the thick solid line frame in FIG. 4, by action of the block write function. In FIG. 7, "CLK" shows a clock pulse.

In response to a block write command supplied from an external device, the block write enable signal 110, the A-bank selection signal 122A and the B-bank selection signal 122B are activated. The A-bank selection signal 122A, the B-bank selection signal 122B and a row address "s" are read in response to a row address strobe signal $\overline{RAS}$, and a heading column address "m" of a block is read in response to a column address strobe signal $\overline{CAS}$, so that sixteen memory cells in total to be written by the block write function are simultaneously selected. These sixteen memory cells correspond to the eight memory cells which are included in the A-bank 104A and which are of the amount corresponding to the three bits of the low order column address signal 118, and the eight memory cells which are included in the B-bank 104B and which are of the amount corresponding to the three bits of the low order column address signal 118. At the same time, the color data 114 is selected as the data to be written into the memory cell array, and the color data 114 written into the eight memory cells is mask-controlled by the column mask data 116 of 8 bits, namely "00001111".

Then, in response to a next block write command supplied from the external device, the block write enable signal 110 and the A-bank selection signal 122A are activated, but the B-bank selection signal 122B is deactivated. In addition, a row address "s+1" is read in response to a row address strobe signal $\overline{RAS}$, and a heading column address "m" of a block is read in response to a column address strobe signal $\overline{CAS}$, so that eight memory cells to be written by the block write function are simultaneously selected. These eight memory cells correspond to the memory cells which are included in the A-bank 104A and which are of the amount corresponding to the three bits of the low order column address signal. At the same time, the color data 114 is selected as the data to be written into the memory cell array, and the color data 114 written into the eight memory cells is mask-controlled by the column mask data 116 of 8 bits, namely, "00001111".

Figure 4:
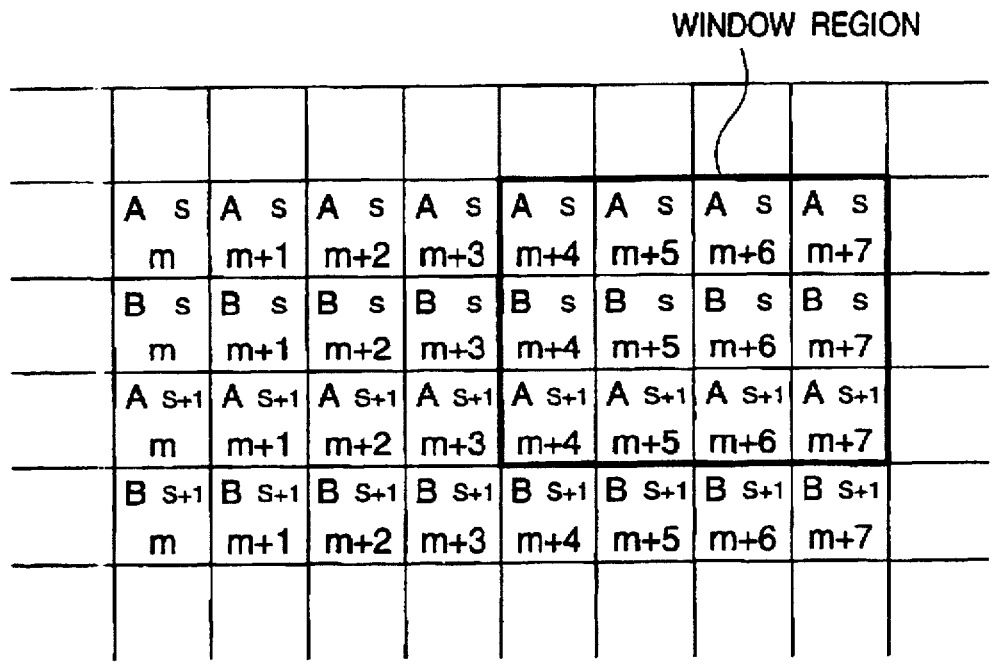
FIG. 4 illustrates a group of pixels, of the display screen shown in FIG. 2, corresponding to one block to be written by a block write function.
Figure 5:
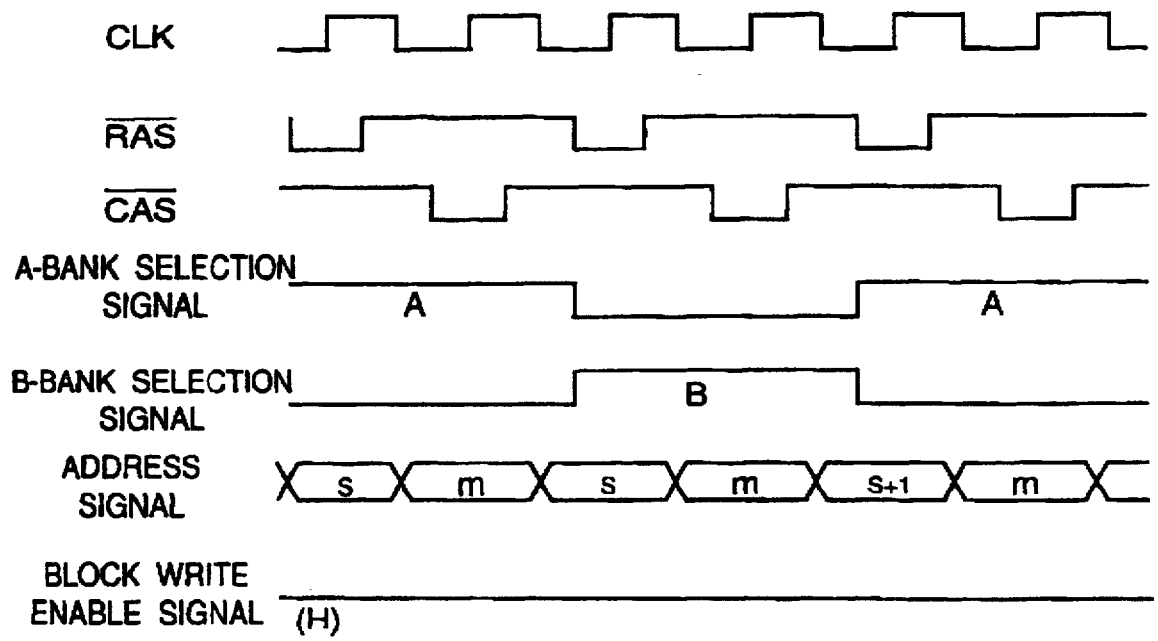
FIG. 5 is a timing chart illustrating an example of the operation of the conventional semiconductor memory shown in FIG. 1, for painting out the pixels surrounded by a thick solid line frame in FIG. 4, by action of the block write function.

Thus, the pixels in the window region defined by the thick solid line frame in FIG. 4 are painted out by the same color data with only two cycles of the block writing as mentioned above.

As would be apparent to persons skilled in the art, if the semiconductor memory in accordance with the present invention is applied to a semiconductor memory of the multiple-bank structure having two or more banks, the writing time of the block writing can be shortened to one divided by the number of banks, as compared with the conventional semiconductor memory.

As mentioned above, the semiconductor memory in accordance with the present invention is characterized by providing a bank selection means controlled by a control signal generated in response to the block write command, for simultaneously activating a plurality of block write enable signals which are supplied to respective block write control means of a corresponding number of banks, so that the color data can be simultaneously written to respective blocks of a plurality of banks, at the time of the block writing.

Therefore, the writing time of the block writing can be shortened to one divided by the number of banks, with the result that the block write function can be remarkably speeded up.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory of a multiple-bank structure having a block write function in which a specific data can be written to a specific block included in a memory cell array and designated by an address signal, comprising:

a plurality of memory banks, each of which includes a memory cell array and an associated block write control means for controlling a block writing to said memory cell array in response to a corresponding one of a plurality of bank selection signals and a block write enable signal generated at the time of the block writing in accordance with a block write command supplied from an external device and designating the block writing, for realizing the block writing to the memory cell array designated by the address signal; and a bank selection means controlled at the time of the block writing by a simultaneous write control signal generated in response to the block write command, for simultaneously generating at least a first bank selection signal and a second bank selection signal from among said plurality of bank selection signals, each of which is supplied to the respective block write control means of a corresponding one of said plurality of said banks, so that the block writing is simultaneously executed in at least two of said banks, wherein said plurality of banks comprise a first memory bank and a second memory bank, and wherein said bank selection means comprises a decoder means receiving said block write enable, said simultaneous write control signal and a bank address signal, for outputting said first bank selection signal to said block write control means of said first memory bank, and said second bank selection signal to said block write control means of said second memory bank, and wherein said decoder means outputs said first bank selection signal and said second bank selection signal such that when at least one of said block write enable signal and said simultaneous write control signal is inactive, said decoder means activates only said first bank selection signal if said bank address signal is active, and only said second bank selection signal if said bank address signal is inactive, and when both of said block write enable signal and said control signal are active, said decoder means simultaneously activates both said first bank selection signal and said second bank selection signal, so that the active first bank selection signal and the active second bank selection signal are simultaneously supplied to said block write control means of said first memory bank and said block control means of said second memory bank, respectively.

2. A semiconductor memory according to claim 1, wherein said block write command includes an address designating bit field designating said address signal, and said simultaneous write control signal corresponds to a portion of said address designating bit field.

3. A semiconductor memory according to claim 1, wherein said decoder means includes an AND gate receiving said block write enable signal and said simultaneous write control signal, an inverter receiving said bank address signal, a first OR gate receiving said bank address signal and an output of said AND gate, for generating said first bank selection signal, and a second OR gate receiving an output of said inverter and said output of said AND gate, for generating said second bank selection signal.

4. A semiconductor memory of a multiple-bank structure having a block write function in which a single data can be written to a selectable multiple cell block of a memory cell array, comprising:

a controller for generating a bank address signal, and for generating a block write enable signal and a simultaneous write bank control signal in response to a block write command received from an external device, wherein said controller has a bank selection means for generating a plurality of bank selection signals based on said bank address signal, said simultaneous write control signal, and said block write enable signal, and wherein at least two of said plurality of bank selection signals are generated simultaneously in response to a concurrence of said simultaneous write control signal and said block write enable signal; and a plurality of banks, each of which includes a memory cell array and an associated block write control means for controlling a block writing to said memory cell array in response to a corresponding one of said bank selection signals and said block write enable signal, wherein, based on an occurrence of said simultaneous at least two of said bank selection signals and said block write enable, a block writing is simultaneously executed in a corresponding plurality of said banks.

5. A semiconductor memory according to claim 4 wherein said block write command includes an address designating bit field designating said address signal, and said simultaneous write control signal corresponds to a portion of said address designating bit field.

* * * * *